United States Patent
Wu et al.

(10) Patent No.: US 7,589,795 B2
(45) Date of Patent: Sep. 15, 2009

(54) AUTOMATIC CLAMPING ANALOG-TO-DIGITAL CONVERTER

(75) Inventors: Chung-Wen Wu, Yilan County (TW); Wen-Hsuan Lin, Taipei County (TW)

(73) Assignee: Novatek Microelectronics Corp., Hsinchu (TW)

( * ) Notice: Subject to any disclaimer, the term of this patent is extended or adjusted under 35 U.S.C. 154(b) by 754 days.

(21) Appl. No.: 11/308,424

(22) Filed: Mar. 23, 2006

(65) Prior Publication Data

US 2007/0182856 A1    Aug. 9, 2007

(30) Foreign Application Priority Data

Feb. 3, 2006    (TW) ............... 95103722 A

(51) Int. Cl.
*H04N 5/18* (2006.01)
*H03M 1/12* (2006.01)

(52) U.S. Cl. .............. 348/572; 348/695; 348/689; 348/677; 348/697; 348/257; 341/155; 341/164

(58) Field of Classification Search .......... 348/695, 348/689, 677, 572, 573, 537, 257, 697; 341/155, 341/144, 164

See application file for complete search history.

(56) References Cited

U.S. PATENT DOCUMENTS

| | | | | |
|---|---|---|---|---|
| 4,970,594 A | * | 11/1990 | Kitaura et al. | 348/697 |
| 5,121,117 A | * | 6/1992 | Rabii | 341/118 |
| 5,532,758 A | * | 7/1996 | Honma | 348/694 |
| 5,841,488 A | * | 11/1998 | Rumreich | 348/694 |
| 6,219,107 B1 | * | 4/2001 | Renner et al. | 348/678 |
| 7,233,365 B2 | * | 6/2007 | Stutz | 348/572 |
| 7,468,760 B2 | * | 12/2008 | Huang et al. | 348/695 |
| 7,535,982 B2 | * | 5/2009 | Chou et al. | 375/355 |
| 2006/0044424 A1 | * | 3/2006 | Shirai et al. | 348/241 |
| 2006/0221243 A1 | * | 10/2006 | Huang et al. | 348/572 |

* cited by examiner

*Primary Examiner*—David L Ometz
*Assistant Examiner*—Jean W Désir
(74) *Attorney, Agent, or Firm*—Jianq Chyun IP Office

(57) ABSTRACT

An automatic clamping analog-to-digital converter (A/D converter) is provided, which includes an A/D converter, a switch, a comparator, a bidirectional counter, and a digital-to-analog converter (D/A converter). Wherein, the A/D converter receives an analog signal from a node, and then converts the analog signal into a digital signal according to a DC offset level. The switch is coupled between the node and a fixed voltage level, and is turned on or off according to a clamping signal. The comparator outputs a compare signal according to a comparison result between the digital signal and an offset value. The bidirectional counter outputs a count, and increases or decreases the count according to the compare signal. The D/A converter converts the count into the DC offset level and provides the DC offset level to the A/D converter.

18 Claims, 2 Drawing Sheets

US 7,589,795 B2

AUTOMATIC CLAMPING ANALOG-TO-DIGITAL CONVERTER

CROSS-REFERENCE TO RELATED APPLICATION

This application claims the priority benefit of Taiwan application serial no. 95103722, filed on Feb. 3, 2006. All disclosure of the Taiwan application is incorporated herein by reference.

BACKGROUND OF THE INVENTION

1. Field of Invention

The present invention relates to an analog-to-digital converter (A/D converter). More particularly, the present invention relates to an automatic clamping A/D converter.

2. Description of Related Art

Presently, an analog-to-digital converter (A/D converter, "ADC") is required in a digital circuit or a device for processing video signal, wherein a video signal is cross linked in AC to ADC, and then is sampled by the ADC to become a digital video signal. FIG. 1 illustrates a conventional video signal processing device 100. FIG. 2 illustrates the waveforms of the video signal and the clamping signal thereof. Referring to both FIG. 1 and FIG. 2, the video signal processing device 100 includes a capacitor 101, a switch 103, a digital-to-analog converter (D/A converter, "DAC") 105 and an A/D converter (ADC) 107.

Wherein, one terminal of the capacitor 101 receives a video signal, while the other terminal thereof is coupled to the first terminal of the ADC 107 and the first terminal of the switch 103. The second terminal of the switch 103 receives a clamping signal CP, and the third terminal thereof receives a fixed voltage level Vfix. The DAC 105 receives an offset value Offset and outputs a DC offset level DL to the ADC 107. Finally, the ADC 107 outputs a digital signal ADC_out.

First, the capacitor 101 is used as a DC blocking capacitor to filter out the DC portion in the received video signal Video and to send the filtered video signal Video to the ADC 107. The switch 103 generates a clamping interval CPI while the clamping signal CP is logic 1, and the filtered video signal Video is pulled up to be above the fixed voltage level Vfix during the clamping interval CPI. Next, the DAC 105 receives an offset value Offset and outputs a DC offset level DL to the ADC 107 according to the offset value Offset. Finally, the ADC 107 converts the received video signal Video into a digital signal ADC_out according to the DC offset level DL output by the DAC 105.

While the video signal processing device 100 is processing the video signal Video, the digital signal ADC_out output by the video signal processing device 100 may not be identical to the offset value Offset, which will result in inaccuracy of the digital signal ADC_out output by the video signal processing device 100.

To solve the aforementioned problem, in the conventional technology, a microcontroller (MCU) is used to adjust the offset value Offset after analyzing the output digital signal ADC_out, and then to fix the offset value Offset when the offset value is optimized. Accordingly, the digital signal ADC_out output by the video signal processing device 100 is made identical to the offset value Offset, so that the digital signal ADC_out is more accurate.

However, misjudgment of the MCU may be caused because the MCU may not be able to detect the clamping interval CPI of the clamping signal CP, or other factors such as drift of the digital signal ADC_out caused by temperature increment of the video signal processing device 100, so that the digital signal ADC_out cannot be made identical to the offset value Offset; besides, adding an MCU will increase the manufacturing cost.

SUMMARY OF THE INVENTION

Accordingly, the present invention is directed to provide an automatic clamping analog-to-digital converter (A/D converter) which can provide a more accurate digital signal without the control of an MCU, and is not affected by temperature or any other factor.

According to the present invention, the automatic clamping A/D converter includes an A/D converter, a comparator, a bidirectional counter, a digital-to-analog converter (D/A converter), and a switch. Wherein, the A/D converter receives an analog signal from a node, and then converts the analog signal into a digital signal according to a DC offset level. The comparator outputs a compare signal according to a comparison result between the digital signal and an offset value. The bidirectional counter outputs a count, and increases or decreases the count according to the compare signal. The D/A converter converts the count into the DC offset level, and then provides the DC offset level to the A/D converter. The switch is coupled between the node and a fixed voltage level, and is turned on or off according to a clamping signal. Besides, at least one of the comparator and the bidirectional counter only works within the clamping interval of the analog signal.

According to another aspect of the present invention, an automatic clamping A/D converter is provided, which includes an A/D converter, a comparator, a bidirectional counter, a D/A converter, and a switch. Wherein, the A/D converter receives an analog signal from a node, and converts the analog signal into a digital signal. The comparator outputs a compare signal according to a comparison result between the digital signal and an offset value. The bidirectional counter outputs a count, and increases or decreases the count according to the compare signal. The D/A converter receives the count. The switch is coupled between the node and the output terminal of the D/A converter, and is turned on or off according to a clamping signal. Besides, at least one of the comparator and the bidirectional counter only works within the clamping interval of the analog signal.

In an embodiment of the present invention, the foregoing analog signal may be a video signal. The comparator and the bidirectional counter only work within the clamping interval, and the comparator and the bidirectional counter get to know whether or not the analog signal is within the clamping interval according to the clamping signal. Wherein, the analog signal is within the clamping interval if the clamping signal is in a predetermined logic status, and the predetermined logic status may be either logic 0 or logic 1. Next, the comparator outputs the compare signal during the clamping interval to make the digital signal identical to the offset value.

In the present embodiment, the switch is turned on if the clamping signal is in a predetermined logic status; otherwise, the switch is turned off, and the predetermined logic status may be either logic 0 or logic 1.

In the present embodiment, the automatic clamping A/D converter further includes a capacitor, which has its first terminal receiving the analog signal and its second terminal coupled to the node.

According to the present invention, a comparator and a bidirectional counter are used in the automatic clamping A/D converter for comparing the digital signal and an offset value during the clamping interval of the analog signal to automatically adjust the digital signal to be identical to the offset value.

Accordingly, the video signal output by the automatic clamping A/D converter is more accurate.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention is to resolve the problem of inaccurate output digital signal in the conventional technology, which may be caused by misjudgment of the microcontroller because the microcontroller may not be able to detect the clamping interval of the clamping signal, or by the drift of the output digital signal caused by the temperature increment of the analog-to-digital converter (A/D converter) or other factors (for example, voltage drift). Thus, the present invention provides an automatic clamping A/D converter to resolve the aforementioned problem.

Figure 1:
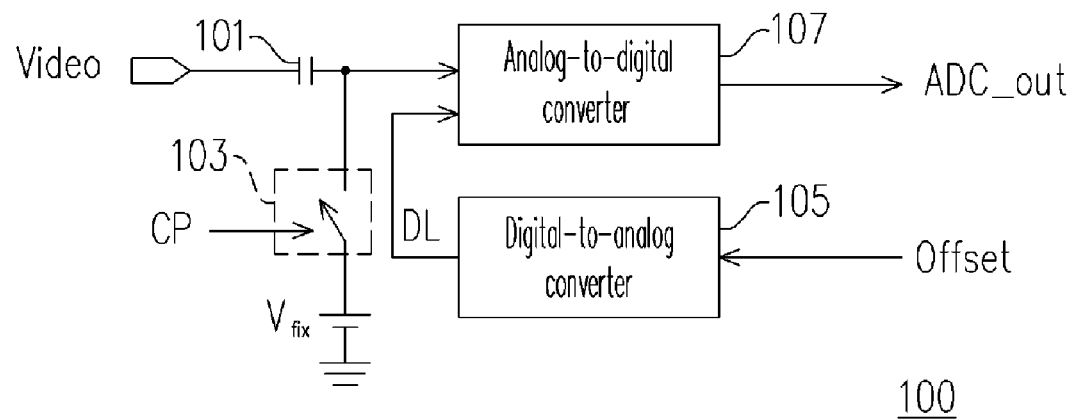
FIG. 1 illustrates a conventional video signal processing device.
Figure 2:
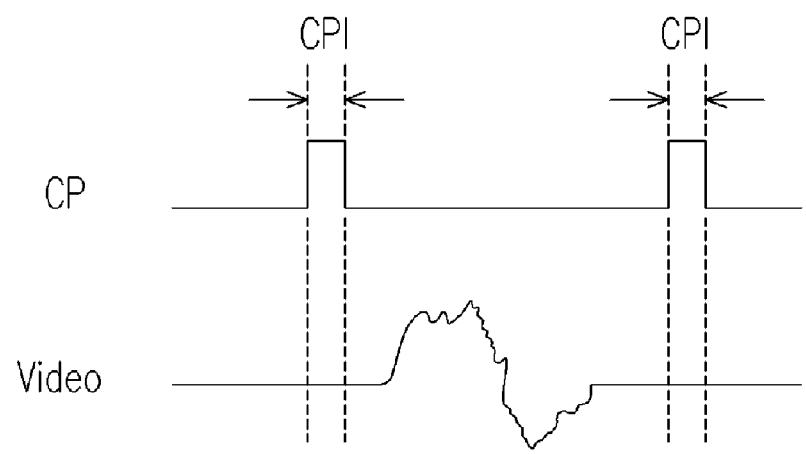
FIG. 2 illustrates the waveforms of a video signal and the clamping signal thereof.
Figure 3:
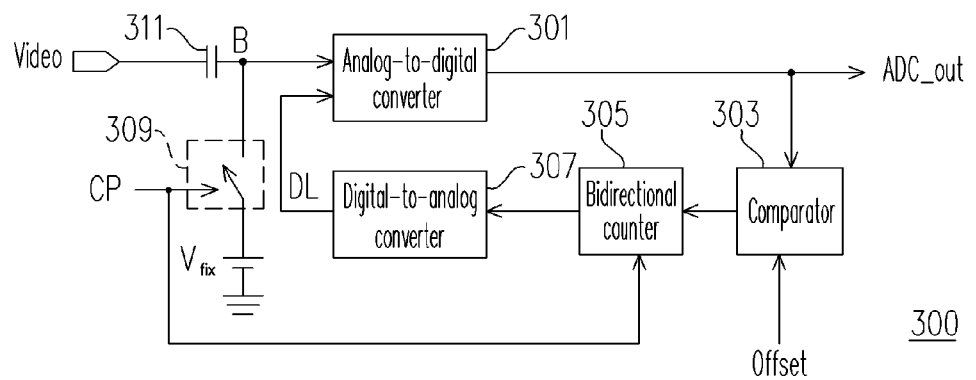
FIG. 3 illustrates an automatic clamping analog-to-digital converter according to an exemplary embodiment of the present invention.

FIG. 3 illustrates an automatic clamping analog-to-digital converter 300 according to an exemplary embodiment of the present invention. Generally, based on the input signals, A/D converters are divided into two structures: differential mode and single ended mode. In the present embodiment, the structure of the differential mode is used for the illustration. Referring to both FIG. 2 and FIG. 3, the automatic clamping A/D converter 300 includes an A/D converter 301, a comparator 303, a bidirectional counter 305, a D/A converter 307, and a switch 309.

In the present embodiment, the automatic clamping A/D converter 300 further includes a capacitor 311 having its first terminal receiving a video signal Video and its second terminal coupled to node B. The switch 309 is coupled between node B and a fixed voltage level Vfix, and is turned on or off according to the logic status of a clamping signal CP. The A/D converter 301 is coupled to the node B and outputs a digital signal ADC_out. The comparator 303 receives the digital signal ADC_out and an offset value Offset, and outputs a compare signal to the bidirectional counter 305. The bidirectional counter 305 receives the compare signal, and then outputs a count to the D/A converter 307 to be converted into a DC offset level DL. Finally, the DC offset level DL converted by the D/A converter 307 is provided to the A/D converter 301.

Wherein, the capacitor 311 is used as a DC blocking capacitor to filter out the DC portion in the received video signal Video. Next, the switch 309 is coupled between node B and a fixed voltage level Vfix, and is turned on while the received clamping signal CP is logic 1. A clamping interval CPI is generated while the clamping signal CP is logic 1, and the filtered video signal Video at node B is pulled up to be above the fixed voltage level Vfix during the clamping interval CPI. The A/D converter 301 converts the video signal Video received from node B into a digital signal ADC_out according to a DC offset level DL, and then transmits the digital signal ADC_out to the comparator 303. After that, the comparator 303 outputs a compare signal according to the comparison result between the digital signal ADC_out and an offset value Offset.

In the present embodiment, the compare signal output by the comparator 303 is generated according to the comparison result between the digital signal ADC_out and the offset value Offset. For example, there are 0~255 digital representations when the offset value Offset is 8-bit. Wherein, 0 is the minimum value min and 255 is the maximum value max. In the present embodiment, the minimum value min of the offset value Offset is set to 1 and the maximum value thereof is set to max−1 (i.e. 254), and the purpose is to more conveniently compare the value smaller than the minimum value 1 (i.e. 0) and the value greater than the maximum value 254 (i.e. 255). In other words, when in the present embodiment, the minimum value min of the offset value Offset is set to 0 and the maximum value max thereof is set to 255, the comparator 303 cannot compare the value smaller than the minimum value 0 and the value greater than the maximum value 255, which may cause the comparator 303 to send a wrong operation compare signal to the bidirectional counter 305, and accordingly causing the output digital signal ADC_out being inaccurate. Thus, in the present embodiment, the minimum value min of the offset value Offset is set to 1 and the maximum value thereof is set to max−1, and this is to provide the bidirectional counter 305 three compare signal statuses, i.e. 'greater than' (>), 'smaller than' (<), and 'equal to' (=), so that the bidirectional counter 305 can produce corresponding operations (i.e. increasing the count, decreasing the count, or stopping the count).

The bidirectional counter 305 outputs a corresponding count (i.e. the count increased, the count decreased, or the count stopped) after it receives one of the three compare signals output by the comparator 303. Wherein, the bidirectional counter 305 stops counting while the compare signal is 'equal to' (=) status; the bidirectional counter 305 produces the corresponding operation (i.e. increasing or decreasing the count) while the compare signal is 'greater than' (>) or 'smaller than' (<) status. The D/A converter 307 converts the count output by the bidirectional counter 305 into a DC offset level DL, and then provides the DC offset level DL to the A/D converter 301. In addition, at least one of the comparator 303 and the bidirectional counter 305 only works within the clamping interval CPI of the analog signal.

In the present embodiment, the digital signal ADC_out is compared to an offset value Offset through the comparator 303, and a compare signal is output for controlling the corresponding operation of the bidirectional counter 305. Next, the D/A converter 307 generates a DC offset level DL according to the count output by the bidirectional counter 305, and sends the DC offset level DL to the A/D converter 301. The DC offset level DL will affect the digital signal ADC_out output by the A/D converter 301 during the clamping interval CPI, and the digital signal ADC_out will further affect the compare signal output by the comparator 303. Through this feedback control mechanism, the digital signal ADC_out will eventually be made identical to the offset value Offset. Thus, the digital signal ADC_out output by the automatic clamping A/D converter 300 during non-clamping interval is also more accurate.

Figure 4:
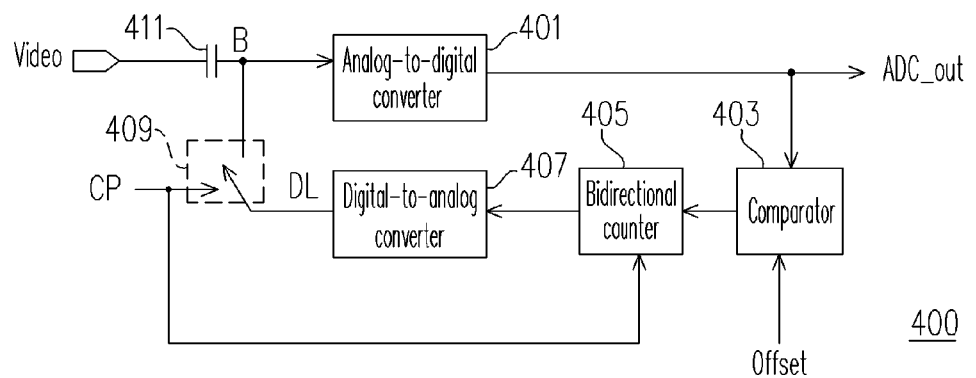
FIG. 4 illustrates an automatic clamping analog-to-digital converter according to another exemplary embodiment of the present invention.

FIG. 4 illustrates an automatic clamping analog-to-digital converter 400 according to another exemplary embodiment of the present invention. In the present embodiment, the structure of single ended mode is described. Referring to both FIG. 2 and FIG. 4, the automatic clamping A/D converter 400 in the present invention includes an A/D converter 401, a comparator 403, a bidirectional counter 405, a D/A converter 407, and a switch 409.

In the present embodiment, the automatic clamping A/D converter 400 further includes a capacitor 411 having its first terminal receiving a video signal Video and its second terminal coupled to node B. The switch 409 is coupled between node B and the D/A converter 407, and is turned on or off according to the logic status of a clamping signal CP. Next, the A/D converter 401 receives the video signal Video from node B, and then converts the video signal Video to output a digital signal ADC_out. The comparator 403 receives the digital signal ADC_out and an offset value Offset, and outputs a compare signal to the bidirectional counter 405. The bidirectional counter 405 receives the compare signal, and then outputs a count to the D/A converter 407 to be converted into a DC offset level DL. Finally, the DC offset level DL converted by the D/A converter 407 is provided to the A/D converter 401.

Wherein, the capacitor 411 is used as a DC blocking capacitor to filter out the DC portion in the received video signal Video. Next, the switch 409 is coupled between node B and the D/A converter 407, and is turned on while the received clamping signal CP is logic 1. A clamping interval CPI is generated while the clamping signal CP is logic 1, and the filtered video signal Video at node B is pulled up to be above the DC offset level DL. The A/D converter 401 converts the video signal Video into the digital signal ADC_out after it receives the filtered video signal Video from node B, and then transmits the digital signal ADC_out to the comparator 403. After that, the comparator 403 outputs the compare signal according to the comparison result between the digital signal ADC_out and an offset value Offset.

In the present embodiment, the compare signal output by the comparator 403 is generated according to the comparison result between the digital signal ADC_out and the offset value Offset. The offset value Offset is the same as that in the foregoing automatic clamping A/D converter 300, so the detail will not be described here again.

The bidirectional counter 405 outputs a corresponding count (i.e. the count increased, the count decreased, or the count stopped) after it receives one of the three compare signals output by the comparator 403. Wherein, the bidirectional counter 405 stops counting while the compare signal is 'equal to' (=) status; the bidirectional counter 405 produces the corresponding operation (i.e. increasing or decreasing the count) while the compare signal is 'greater than' (>) or 'smaller than' (<) status. The D/A converter 407 converts the count output by the bidirectional counter 405 into the DC offset level DL, and then provides the DC offset level DL to the switch 409. In addition, at least one of the comparator 403 and the bidirectional counter 405 only works within the clamping interval CPI of the analog signal.

In the present embodiment, the digital signal ADC_out is compared to an offset value Offset through the comparator 403, and a compare signal is output for controlling the corresponding operation of the bidirectional counter 405. Next, the D/A converter 407 generates the DC offset level DL according to the count output by the bidirectional counter 405. The DC offset level DL affects the digital signal ADC_out output by the A/D converter 401 during the clamping interval CPI, and the digital signal ADC_out further affects the compare signal output by the comparator 403. Through this feedback control mechanism, the digital signal ADC_out will eventually be made identical to the offset value Offset. Thus, the digital signal ADC_out output by the automatic clamping A/D converter 400 during the non-clamping interval is also more accurate.

In the foregoing embodiments, the comparator 303, the comparator 403, the bidirectional counter 305, and the bidirectional counter 405 only work within the clamping interval CPI, and the comparator 303, the comparator 403, the bidirectional counter 305, and the bidirectional counter 405 get to know whether or not the video signal Video is within the clamping interval CPI according to the clamping signal CP. Wherein, the analog signal Video is within the clamping interval CPI if the clamping signal is in a predetermined logic status, and the predetermined logic status may be either logic 0 or logic 1.

In the present embodiment, the switch 309 and the switch 409 are turned on if the clamping signal CP is in a predetermined logic status; otherwise, the switch 309 and the switch 409 are turned off, and the predetermined logic status may be either logic 0 or logic 1.

In other embodiments of the present invention, a general analog signal can also be received besides the video signal Video. The present invention can be applied as long as the analog signal needs to be corrected during the clamping interval. In other words, according to the spirit of the present invention, the automatic clamping A/D converter 300 and the automatic clamping A/D converter 400 can be applied to the related areas of analog signal processing.

In overview, the present invention provides an automatic clamping A/D converter, wherein a comparator and a bidirectional counter are used for replacing the microcontroller in the conventional technology to compare the digital signal output by the A/D converter and an offset value during the clamping interval, so as to automatically and gradually adjust the digital signal to be identical to the offset value. Accordingly, the output digital signal is more accurate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An automatic clamping analog-to-digital converter (A/D converter), comprising:
   an A/D converter, receiving an analog signal from a node, converting the analog signal into a digital signal according to a DC offset level, and outputting the digital signal;
   a comparator, outputting a compare signal according to a comparison result between the digital signal and an offset value;
   a bidirectional counter, outputting a count, and increasing or decreasing the count according to the compare signal;
   a digital-to-analog converter (D/A converter), converting the count into the DC offset level, providing the DC offset level to the A/D converter; and
   a switch, coupled between the node and a fixed voltage level, being turned on or off according to a clamping signal;

wherein at least one of the comparator and the bidirectional counter only works within a clamping interval of the analog signal.

2. The automatic clamping A/D converter as claimed in claim 1, wherein the analog signal is a video signal.

3. The automatic clamping A/D converter as claimed in claim 1, wherein the comparator only works within the clamping interval, and the comparator decides whether or not the analog signal is within the clamping interval according to the clamping signal.

4. The automatic clamping A/D converter as claimed in claim 3, wherein the analog signal is within the clamping interval if the clamping signal is in a predetermined logic status, and the predetermined logic status is one of logic 0 and logic 1.

5. The automatic clamping A/D converter as claimed in claim 1, wherein the bidirectional counter only works within the clamping interval, and the bidirectional counter decides whether or not the analog signal is within the clamping interval according to the clamping signal.

6. The automatic clamping A/D converter as claimed in claim 5, wherein the analog signal is within the clamping interval if the clamping signal is in a predetermined logic status, and the predetermined logic status is one of logic 0 and logic 1.

7. The automatic clamping A/D converter as claimed in claim 1, wherein during the clamping interval, the comparator outputs the compare signal to make the digital signal identical to the offset value.

8. The automatic clamping A/D converter as claimed in claim 1, wherein the switch is turned on if the clamping signal is in a predetermined logic status, otherwise, the switch is turned off, and the predetermined logic status is one of logic 0 and logic 1.

9. The automatic clamping A/D converter as claimed in claim 1, further comprising:
a capacitor, the first terminal of the capacitor receiving the analog signal, the second terminal of the capacitor being coupled to the node.

10. An automatic clamping A/D converter, comprising:
an A/D converter, receiving an analog signal from a node, converting the analog signal into a digital signal, and outputting the digital signal;
a comparator, outputting a compare signal according to a comparison result between the digital signal and an offset value;
a bidirectional counter, outputting a count, and increasing or decreasing the count according to the compare signal;
a D/A converter, receiving the count; and
a switch, coupled between the node and the output terminal of the D/A converter, being turned on or turned off according to a clamping signal;
wherein at least one of the comparator and the bidirectional counter only works within a clamping interval of the analog signal.

11. The automatic clamping A/D converter as claimed in claim 10, wherein the analog signal is a video signal.

12. The automatic clamping A/D converter as claimed in claim 10, wherein the comparator only works within the clamping interval, and the comparator decides whether or not the analog signal is within the clamping interval according to the clamping signal.

13. The automatic clamping A/D converter as claimed in claim 12, wherein the analog signal is within the clamping interval if the clamping signal is in a predetermined logic status, and the predetermined logic status is one of logic 0 and logic 1.

14. The automatic clamping A/D converter as claimed in claim 10, wherein the bidirectional counter only works within the clamping interval, and the bidirectional counter decides whether or not the analog signal is within the clamping interval according to the clamping signal.

15. The automatic clamping A/D converter as claimed in claim 14, wherein the analog signal is within the clamping interval if the clamping signal is a predetermined logic status, and the predetermined logic status is one of logic 0 and logic 1.

16. The automatic clamping A/D converter as claimed in claim 10, wherein during the clamping interval, the comparator outputs the compare signal to make the digital signal identical to the offset value.

17. The automatic clamping A/D converter as claimed in claim 10, wherein the switch is turned on if the clamping signal is in a predetermined logic status, otherwise, the switch is turned off, and the predetermined logic status is one of logic 0 and logic 1.

18. The automatic clamping A/D converter as claimed in claim 10, further comprising:
a capacitor, the first terminal of the capacitor receiving the analog signal, the second terminal of the capacitor being coupled to the node.

* * * * *